(12) United States Patent
Hovel et al.

(10) Patent No.: US 8,878,259 B2
(45) Date of Patent: Nov. 4, 2014

(54) SUPER LATTICE/QUANTUM WELL NANOWIRES

(75) Inventors: Harold J. Hovel, Katonah, NY (US); Qiang Huang, Sleepy Hollow, NY (US); Xiaoyan Shao, Yorktown Heights, NY (US); James Vichiconti, Carmel, NY (US); George F. Walker, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/555,383

(22) Filed: Jul. 23, 2012

(65) Prior Publication Data

US 2012/0286236 A1 Nov. 15, 2012

Related U.S. Application Data

(62) Division of application No. 12/054,886, filed on Mar. 25, 2008, now Pat. No. 8,273,591.

(51) Int. Cl.
*H01L 29/94* (2006.01)
*H01L 29/76* (2006.01)
(Continued)

(52) U.S. Cl.
CPC .......... *H01L 31/18* (2013.01); *B82Y 10/00* (2013.01); *B82Y 30/00* (2013.01); *C30B 29/02* (2013.01); *C30B 29/06* (2013.01); *C30B 29/40* (2013.01); *C30B 29/52* (2013.01); *C30B 29/60* (2013.01); *C30B 29/605* (2013.01); *C30B 33/10* (2013.01); *H01L 21/30604* (2013.01); *H01L 29/0665* (2013.01); *H01L 29/0673* (2013.01); *H01L 29/0676* (2013.01); *H01L 29/068* (2013.01); *H01L 29/125* (2013.01); *H01L 31/0352* (2013.01); *H01L 33/20* (2013.01)
USPC ...... 257/288; 257/9; 257/E29.255; 257/E31.034; 257/E29.024; 438/39; 438/46; 438/606; 438/652; 438/733

(58) Field of Classification Search
None
See application file for complete search history.

(56) References Cited

U.S. PATENT DOCUMENTS 6,656,573 B2 12/2003 Chen et al.
6,773,616 B1 8/2004 Chen et al.
(Continued)

FOREIGN PATENT DOCUMENTS

EP 0544408 A2 6/1993
EP 1703569 A2 9/2006
(Continued)

OTHER PUBLICATIONS

International Search Report for International Appl. PCT/US09/32339, mailed Mar. 30, 2009.
(Continued)

*Primary Examiner* — Zandra Smith
*Assistant Examiner* — Khanh Duong
(74) *Attorney, Agent, or Firm* — Novak Druce Connolly Bove + Quigg LLP; Louis J. Percello, Esq.

(57) ABSTRACT

Segmented semiconductor nanowires are manufactured by removal of material from a layered structure of two or more semiconductor materials in the absence of a template. The removal takes place at some locations on the surface of the layered structure and continues preferentially along the direction of a crystallographic axis, such that nanowires with a segmented structure remain at locations where little or no removal occurs. The interface between different segments can be perpendicular to or at angle with the longitudinal direction of the nanowire.

24 Claims, 6 Drawing Sheets

(51) Int. Cl.

| | | |
|---|---|---|
| *H01L 31/119* | (2006.01) | |
| *H01L 31/113* | (2006.01) | |
| *H01L 31/062* | (2012.01) | |
| *H01L 31/18* | (2006.01) | |
| *B82Y 10/00* | (2011.01) | |
| *B82Y 30/00* | (2011.01) | |
| *C30B 29/02* | (2006.01) | |
| *C30B 29/06* | (2006.01) | |
| *C30B 29/40* | (2006.01) | |
| *C30B 29/52* | (2006.01) | |
| *C30B 29/60* | (2006.01) | |
| *C30B 33/10* | (2006.01) | |
| *H01L 21/306* | (2006.01) | |
| *H01L 29/06* | (2006.01) | |
| *H01L 29/12* | (2006.01) | |
| *H01L 31/0352* | (2006.01) | |
| *H01L 33/20* | (2010.01) | |

(56) References Cited

U.S. PATENT DOCUMENTS

| | | | |
|---|---|---|---|
| 6,882,051 B2 | 4/2005 | Majumdar et al. | |
| 6,962,823 B2 | 11/2005 | Empedocles et al. | |
| 7,002,207 B2 | 2/2006 | Kim et al. | |
| 7,105,428 B2 * | 9/2006 | Pan et al. | 438/584 |
| 7,181,836 B2 | 2/2007 | Tsakalakos | |
| 7,211,143 B2 | 5/2007 | Yang et al. | |
| 7,301,199 B2 | 11/2007 | Lieber et al. | |
| 7,307,271 B2 | 12/2007 | Islam et al. | |
| 7,402,215 B2 * | 7/2008 | Ohashi et al. | 148/320 |
| 7,625,812 B2 | 12/2009 | Choi et al. | |
| 7,642,578 B2 | 1/2010 | Lee et al. | |
| 7,829,139 B2 * | 11/2010 | Reeves et al. | 427/197 |
| 2001/0044200 A1 | 11/2001 | Chen et al. | |
| 2004/0005723 A1 | 1/2004 | Empedocles et al. | |
| 2005/0133254 A1 | 6/2005 | Tsakalakos | |
| 2005/0248003 A1 | 11/2005 | Tsybeskov et al. | |
| 2006/0097389 A1 | 5/2006 | Islam et al. | |
| 2006/0098705 A1 | 5/2006 | Wang et al. | |
| 2006/0207647 A1 | 9/2006 | Tsakalakos et al. | |
| 2006/0223211 A1 | 10/2006 | Mishra et al. | |
| 2006/0255481 A1 | 11/2006 | Pan et al. | |
| 2007/0181889 A1 | 8/2007 | Orita | |
| 2007/0200477 A1 | 8/2007 | Tuominen et al. | |
| 2007/0222074 A1 | 9/2007 | Bakkers et al. | |
| 2007/0235738 A1 | 10/2007 | Jin et al. | |

FOREIGN PATENT DOCUMENTS

| | | |
|---|---|---|
| JP | H05-175123 A | 7/1993 |
| JP | H05-218499 A | 8/1993 |
| JP | 2003-101069 A | 4/2003 |
| JP | 2003-301240 A | 10/2003 |
| JP | 2004-532133 A | 10/2004 |
| JP | 2005-522030 A | 7/2005 |
| JP | 2006-261666 A | 9/2006 |
| JP | 2006-270107 A | 10/2006 |
| JP | 2007-535412 A | 12/2007 |
| JP | 2007-535413 A | 12/2007 |
| JP | 2009-524264 A | 6/2009 |
| WO | WO-03083919 A2 | 10/2003 |
| WO | WO-2007/083152 A1 | 7/2007 |

OTHER PUBLICATIONS

"One-step Patterning of Aligned Nanowire Arrays by Programmed Dip Coating," Huang et al, Angew. Chem. Int. Ed. vol. 46, 2414-2417 (2007).

"Aligned Single-Crystalline Si Nanowire Arrays for Photovoltaic Applications," Peng et al., small, vol. 1, No. 11, 1062-1067, (2005).

"Dendrite-Assisted Growth of Silicon Nanowires in Electroless Metal Deposition," Peng et al., Adv. Funct. Mater. vol. 13, No. 2, Feb. 2003.

"Simultaneous gold deposition and formation of silicon nanowire arrays," Peng et al., J. of Electroanal. Chem., vol. 558, 35-39, (2003).

"Synthesis of Large-Area Silicon Nanowire Arrays via Self-Assembling Nanoelectrochemistry," Peng et al., Adv. Mater. vol. 14, No. 16, Aug. 16, 2002.

Ming-Liang Zhang, Kui-Qing Pwng, Xia Fan, Jian-Sheng Jie, Rui-Qin Zhang, Shuit-Tong Lee, Ning-Bew Wong, "Preparation of Large-Area Uniform Silicon Nanowires Arrays through Metal-Assisted Chemical Etching", Journal of Physics Chemistry C, Mar. 4, 2008, vol. 112, No. 12, pp. 4444-4450.

Kui-Qing Peng, Yun-Jie Yan, Shang-Peng Bao, Jin Zhu, "Synthesis of Large-Area Silicon Nanowire via Self-Assembling Nanoelectrochemistry", Advanced Materials, Aug. 16, 2002, vol. 14, No. 16, pp. 1164-1167.

Kuiqing Peng, Mingliang Zhang, Aijiang Lu, Ning-Bew Wong, Ruiqin Zhang and Shuit-Tong Lee, "Ordered silicon nanowire arrays via nanosphere lithography and metal-induced etching", Applied Physics Letters, Apr. 20, 2007, vol. 90, No. 16, pp. 163123-1-3.

Peng et al., "Uniform, axial-orientation of one dimensional single-crystal silicon nanostructure arrays", Angewandte Chemie International Edition, 2005, 44, 2737-3742.

Extended Search Report dated Apr. 4, 2014 issued in corresponding EP Application No. 09724159.

* cited by examiner

Related Art

SUPER LATTICE/QUANTUM WELL NANOWIRES

CROSS REFERENCE TO RELATED APPLICATION

This application is a Divisional of co-pending U.S. application Ser. No. 12/054,886, filed on Mar. 25, 2008, the entire contents of which are hereby incorporated by reference.

TECHNICAL FIELD

The present disclosure relates to nanowires comprising segments of different semiconductor materials and a method of making these nanowires. More particularly, the disclosure is related to nanowires comprising a built-in super lattice/quantum well structure.

BACKGROUND

Semiconductor nanowires are gaining interest as components for micro- and nanoscale devices due to their novel electrical and optical properties that include new realms of physics stemming from the quantum mechanical dimension of these nanowires. Materials such as SiGe, strained Si, superlattices, and quantum wells in their bulk form have unique properties, which make these materials useful in a number of optical and electrical devices.

Traditionally, silicon nanowires have been grown epitaxially on top of a silicon substrate using chemical vapor deposition method, such as the method described in US2007/0222074 A1 or growing Si nanowires in a patterned template defined by diblock copolymer on top of a silicon substrate. US2006/0098705 A1 describes a method of growing Si nanowires and quantum dots on top of a patterned silicon substrate by the chemical vapor deposition (CVD) method. US 2005/0248003 A1 describes a method of forming heterojunction nanowires by a chemical vapor method. US 2007/0235738 A1 describes a method to form p-Si/n-Si nanowire junction with embedded quantum dots by CVD.

The chemical method of etching a uniformly doped Si substrate to form Si nanowires has been discussed in the published work of K. Q. Peng et al. (Adv. Mater. 14 (2002) 1164; J. Electroanal. Chem. 558 (2003) 35; Adv. Funct. Mates. 13 (2003) 127). FIG. 1 shows a schematic of how silicon nanowires were obtained by the method of Peng et al.

SUMMARY OF THE INVENTION

Disclosed herein are segmented nanowires and a method of producing these segmented nanowires. The nanowires disclosed herein have a high probability of exhibiting even more novel physical properties by combining superlattice and quantum well structures in a nanowire form, creating a three-dimensional quantum well structure instead of the normal two-dimensional.

After forming a substrate of two or more layers of semiconductor materials, the substrate is partially removed without using a template by chemical etching. Initially, the chemical etching begins at some locations on the surface of the substrate. The semiconductor material can be oriented with a particular crystal plane towards the surface, such as the (1 1 1) or the (1 1 0) plane. The chemical etching occurs predominantly along a crystallographic axis of the semiconductor material, for silicon it is the [1 0 0] direction, such that nanowires having segments of different materials corresponding to the materials in the different layers remain at locations at which little or no chemical etching occurred. The interface between different segments can be perpendicular to or at an angle with the longitudinal direction of the segmented nanowire.

The disclosed chemical etching method is a subtractive approach that creates semiconductor nanowires with SiGe, Ge quantum well structures, and vertical junctions within silicon nanowires out of a planar substrates with two or more different semiconductor layers.

DETAILED DESCRIPTION OF THE VARIOUS EMBODIMENTS

A multi-layer substrate comprising various alternating semiconductor layers such as Si/SiGe/Si/SiGe, Si/Ge/Si/Ge, or n-Si/p-Si/n-Si alternating layers is subjected to a chemical etching treatment. The substrate is etched to form semiconductor nanowires with embedded quantum wells or a superlattice structure within the semiconductor nanowires. A preferred semiconductor is silicon. Particularly preferred are n-doped and p-doped silicon. Specifically, disclosed herein are nanowires containing multiple layers of alternate materials with quantum dimensions. For example, Si nanowires having Ge or SiGe layers in a stacked geometry. The quantum well is derived by incorporating alternate layers of Si, SiGe, Si, SiGe, etc. The structure is not limited to SiGe; Ge nanowires could incorporate GaAs layers, Si nanowires could incorporate GaP, GaAsP, or other III-V or II-VI material. Such a sea of quantum well nanowires would exhibit modifications in optical properties such as enhanced absorption due to modifications in the band structure as well as modified electrical properties. In some embodiments, the cross-section of the wires are smaller in one dimension than in the other, i.e., the cross-section is elliptical rather than circular. Being able to control all three dimensions of a segment in a nanowire allows fine-tuning the electrical and optical properties. Specific examples are set forth below.

Accordingly, a layer in the substrate containing two or more layers corresponds to a segment of the nanowire obtained from the substrate. Thus, the term layered nanowire is used interchangeably herein with the term segmented nanowire. Further, some embodiments consist of two segments whereas other embodiments consist of a plurality of segments. The disclosure of a certain number of segments shall not be construed to mean that a segmented nanowire may not contain additional segments.

The thickness of a layer in the substrate is the main factor determining the length of a segment in the resulting nanowire. The thickness of a layer can be adjusted depending on the epitaxial growth parameters or the polycrystalline growth parameters. Doped top silicon layer with a thickness of between 10 nm and 10 microns have been produced. The SiGe and Ge layers can be between 10 nm and 10 microns as well.

Figure 1:
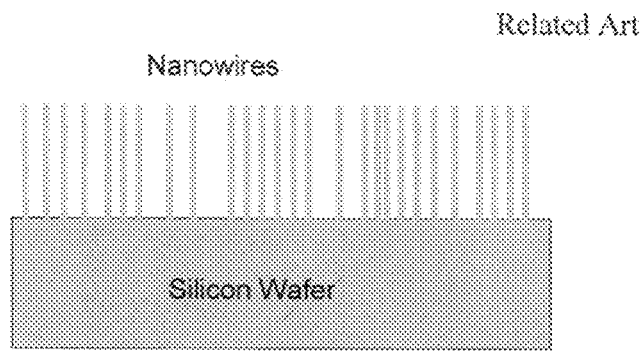
FIG. 1 shows a schematic of the related art method for producing etched, non-segmented silicon nanowires on a silicon wafer.
Figure 2:
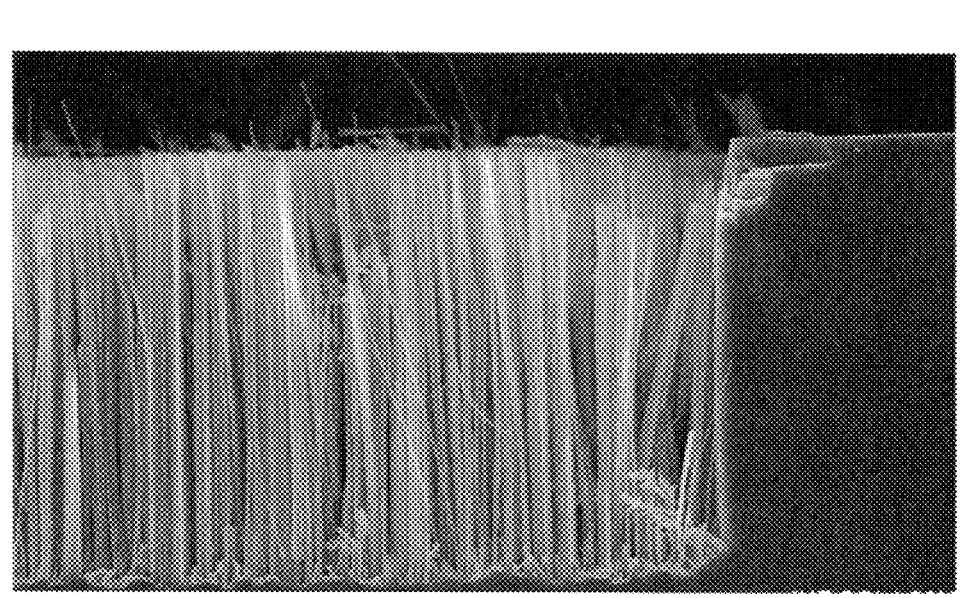
FIG. 2 shows a SEM cross section view of silicon nanowires formed by chemical etching of a (1 0 0) silicon substrate.

FIG. 2 shows the formation of silicon nanowires by using the same chemical etching method of uniform (100) Si substrate. The protected edge on the right is shown to indicate that the formation of silicon nanowires starts from the top surface of the substrate.

Figure 3:
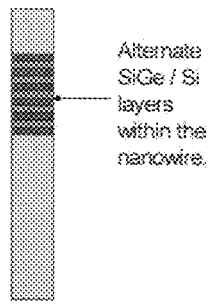
FIG. 3 shows a schematic cross-section of a segmented nanowire with incorporated quantum wells.

Si nanowires have been obtained by etching the (1 0 0) plane of a Si wafer surface with an HF—$AgNO_3$ solution. Small particles of Ag deposited on the surface caused enhanced etching at some locations; however, at locations where no Ag particles were present, etching was strongly reduced. The result is a sea of vertical nanowires on the Si substrate, as shown in FIG. 3. The Ag particles are later removed by acid etching. A preferred acid for Ag removal is aqua regia. Another preferred acid is nitric acid. The wires and the substrate surface are left clean of reaction byproducts which plague other methods of creating nanowires.

In a preferred embodiment, the chemical etching reagent is a mixture of silver nitrate ($AgNO_3$) and hydrogen fluoride (HF) in aqueous solution. A preferred molar ratio of HF to $AgNO_3$ is 120 to 480, particularly preferred is a range of about 240. The etching solution used for obtaining the nanowires in FIG. 3 contained a 1:1 mixture of 3.4 g/l (0.02M) $AgNO_3$+1:5 (4.8M) HF solution, accordingly the molar ratio of HF/$AgNO_3$ in the solution was equal to 240. The 1:1 mixture of $AgNO_3$/HF can also be either diluted or concentrated up to 5-10 times and still form semiconductor nanowires but with substantial difference in etching rate. If the solution contained a large excess of $AgNO_3$, for example, an HF/$AgNO_3$ molar ratio of 24, the etching became planar without resulting in the formation of nanowires. A large excess of HF in the solution, for example, an HF/$AgNO_3$ molar ratio of 2400, did not result in the formation of nanowires and the silicon was barely etched at all.

A solution temperature in the range between 0° C. and 90° C. is preferred, with a temperature around room temperature being particularly preferred. The main effect of the solution temperature on the nanowire formation is that the etching rate increases with increasing temperature. Nanowires with a length between 1.0 and 1.5 micron have been obtained after 10-minutes etching at a temperature of 20° C. in the standard solution of 3.4 g/l (0.02M) $AgNO_3$ plus 1:5 (4.8M) HF.

The wire cross-sectional dimension ranged from 10 nm to 500 nm, and were faceted and not round. Usually one dimension was smaller than the other, and under some conditions the nanowires were in the shape of a nano-ribbon. The etching rate is dependent on the solution concentration, solution temperature, and also the agitation. A (1 0 0) silicon substrate immersed in the standard solution (3.4 g/l (0.02M) $AgNO_3$ plus 1:5 (4.8M) HF) at a temperature of 20° C. for 30 minutes resulted in about 3 micron long nanowires. The same substrate immersed in the standard solution at temperature of 35° C. for 30 minutes gave about 6 micron long nanowires, and the same substrate in the same solution at a temperature of 50° C. for 30 minutes gave about 16 micron long nanowires. When the same experiments were carried out in an ultrasonication tank, which provides strong agitation, the etching rate doubled compared to a stationary etching solution.

The etching rate is not particularly sensitive to the dopant type or the dopant density in the semiconductor substrate, except for undoped silicon (intrinsic silicon). Doping with P, B, or As, resulting in resistivities of 0.01 ohm·cm and 100 ohm·cm for both p-type and n-type dopants, produced semiconductor nanowires of similar length and geometry. Intrinsic silicon, however, behaved quite differently. The etching rate of intrinsic silicon (resistivity of 9999 ohm·cm) was 20 times slower than in doped silicon samples.

Figure 4A:
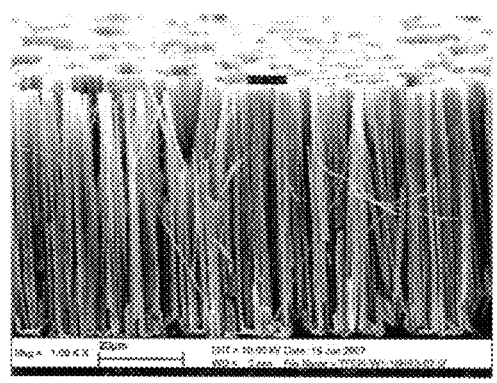
FIGS. 4a and 4b show SEM images of a cross-section and a top down view of Si/SiGe/Si nanowires formed by chemical etching.
Figure 4B:
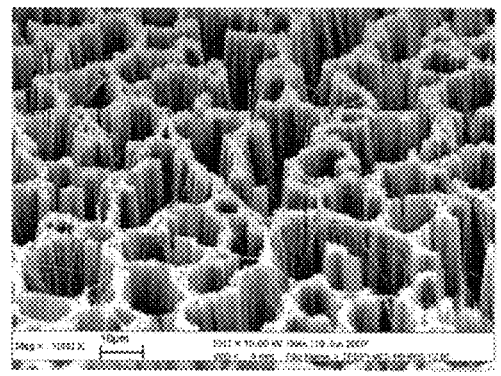

Si nanowires with SiGe quantum wells can be produced by epitaxially growing alternate layers of Si and SiGe on a Si substrate. The layers can be made thin by the epi process, such that the SiGe thickness is below the critical thickness and no relaxation/defects take place. Upon performing the Ag-enhanced etching, nanowires containing SiGe/Si quantum wells are produced, as shown in FIG. 3. It has been found that SiGe layers on Si can also be etched in the same fashion; FIGS. 4a and 4b respectively show the cross section and top down SEM images of such a sample with etched Si nanowires with embedded SiGe quantum dots using a multilayer substrate.

Figure 5:
FIG. 5 shows the schematic of the preparation of nanowires with a vertical p-n junction.
Figure 6:
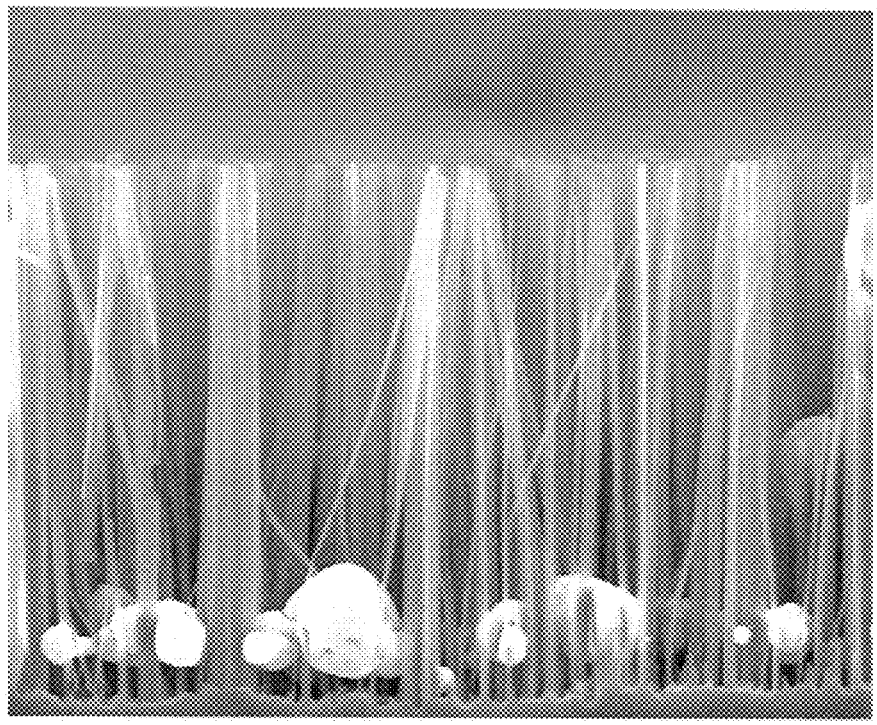
FIG. 6 shows a cross-section of nanowires with a vertical p-n junction prepared according to the schematic in FIG. 5.

Si nanowires with built-in vertical p-n junctions can be created by doping a silicon substrate with p- and n-dopants and then followed by chemical etching in $AgNO_3$-HF solutions. FIG. 5 shows the sequence of creating silicon nanowires with p-n junctions and FIG. 6 shows a cross section SEM image of such a sample after etching.

The choice of materials is only dependent on the ability to grow epitaxial layers, and possibly polycrystalline growth layers would also exhibit this effect. Examples of material pairs where such quantum nanowires can be produced are Si/SiGe, Si/GaP, Si/GaP, Si/GaAsP, Si/ZnS, Ge/GaAs, Ge/Si, Ge/GaInAs, Ge/ZnSe, etc. It is also evident that the different layers can be conductivity-doped during the epitaxial growth, creating electric fields within the nanowire and within the quantum well.

Further, more than two different materials can be used as materials for the substrate layers, opening up even more new physics/materials effects. In one embodiment, Si/SiGe/GaAs three-segment quantum layers contained in a nanowire can be produced. In another embodiment, an insulating layer is provided between a p-doped and an n-doped layer. The only factor limiting the nature of the structure is the starting growth process used to produce the multiple layers. Also, while the enhanced etching leading to nanowires and quantum well nanowires has been shown with $AgNO_3$ chemical etching, other chemicals are expected to exhibit similar effects and different chemicals may be optimally suited for different material combinations.

Figure 7:
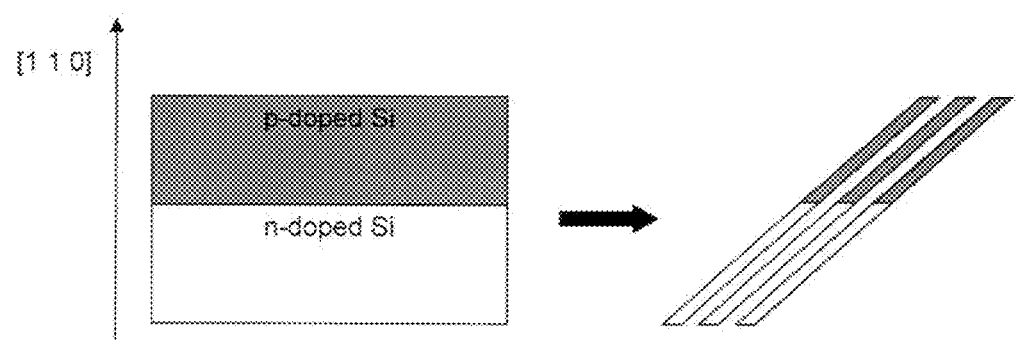
FIG. 7 shows silicon nanowires obtained from a substrate etched from the (1 1 0) plane, the n-doped and p-doped segments forming a 60 degree angle with the longitudinal direction of the nanowire, which corresponds to the silicon [1 0 0] crystalline direction.

FIG. 7 shows a Si substrate oriented with the (1 1 0) plane towards the surface. The substrate was treated by the chemical etching method. SEM images revealed that the etching occurred preferentially along the [1 0 0] axis, i.e., in a 60° angle towards the surface. Nanowires obtained by that method have an interface between different segments that is oriented at a 60° angle towards the longitudinal direction of the nanowire.

Figure 8:
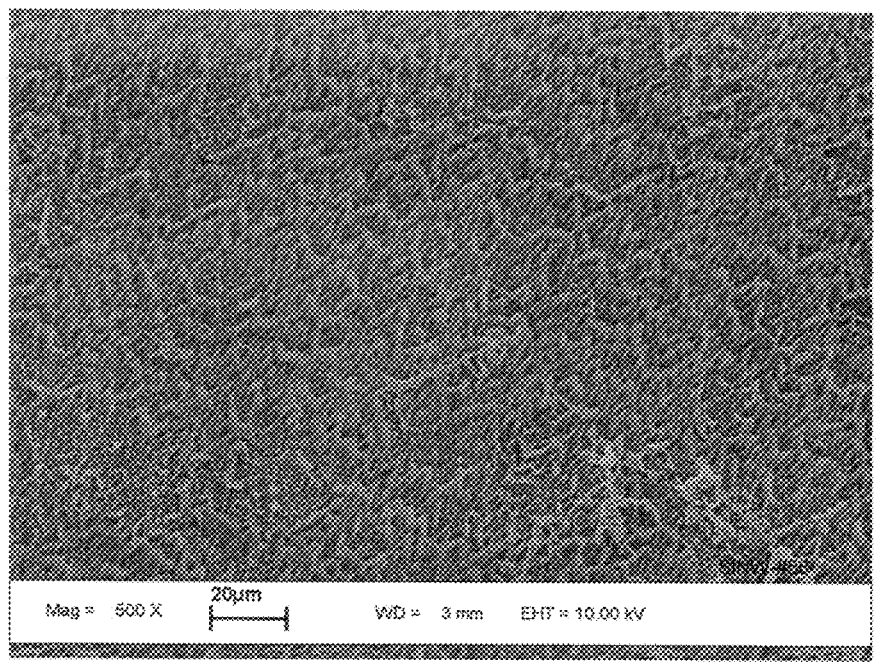
FIG. 8 shows a top-down view, 500-fold magnification of silicon nanowires obtained from a substrate etched from the (1 1 1) plane.

FIG. 8 shows a two layer Si substrate oriented with the (1 1 1) plane towards the surface. The substrate was treated by the chemical etching method.

Figure 9:
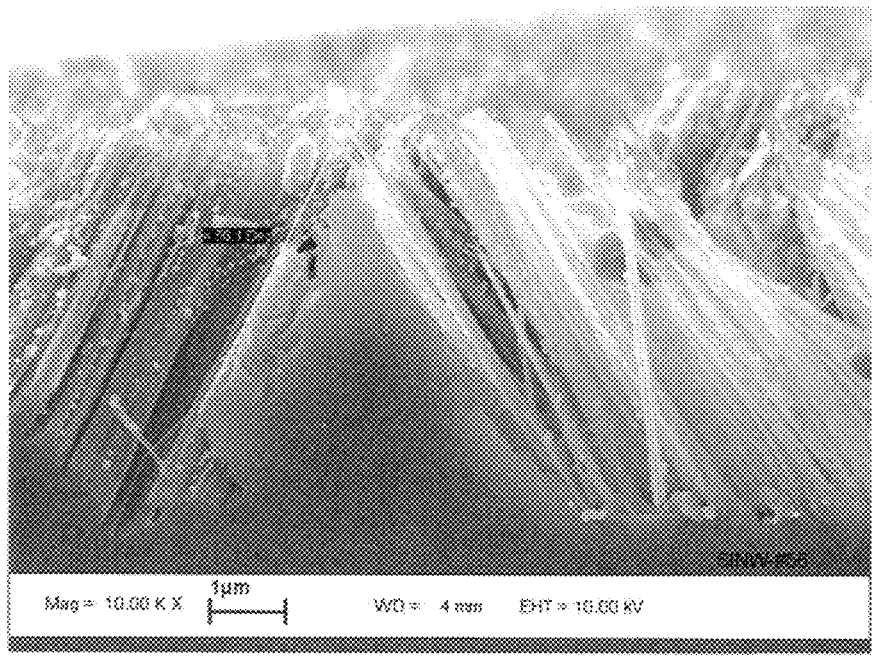
FIG. 9 shows a side-view SEM image, 10,000-fold magnification of silicon nanowires obtained from a substrate etched from the (1 1 1) plane, the nanowires forming a 54.7 degree angle with the substrate.

FIG. 9 shows SEM images revealed that the etching occurred preferentially along the axis, i.e., that the nanowires are oriented in an angle of 54.7° towards the surface. The nanowires that were obtained by this method have an interface between different segments that is oriented in a 54.7° angle towards the longitudinal direction of the nanowire.

Figure 10:
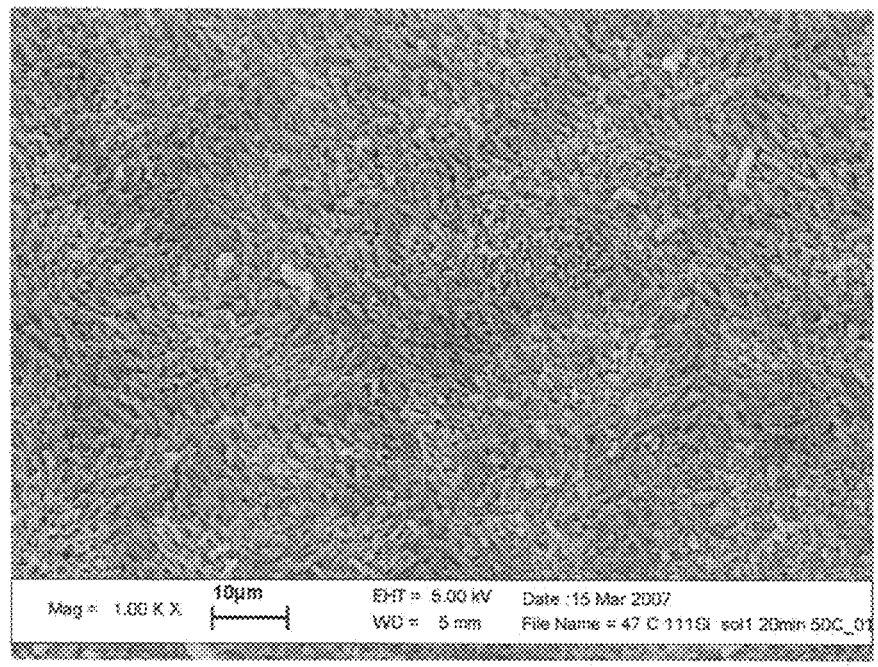
FIG. 10 shows a top-down view, 1,000-fold magnification of silicon nanowires obtained from a substrate etched from the (1 1 1) plane.

FIG. 10 shows a top-down view, 1,000-fold magnification of silicon nanowires obtained from a substrate etched from the (1 1 1) plane. Etching was performed for 20 minutes at 50° C. using the original solution.

Figure 11:
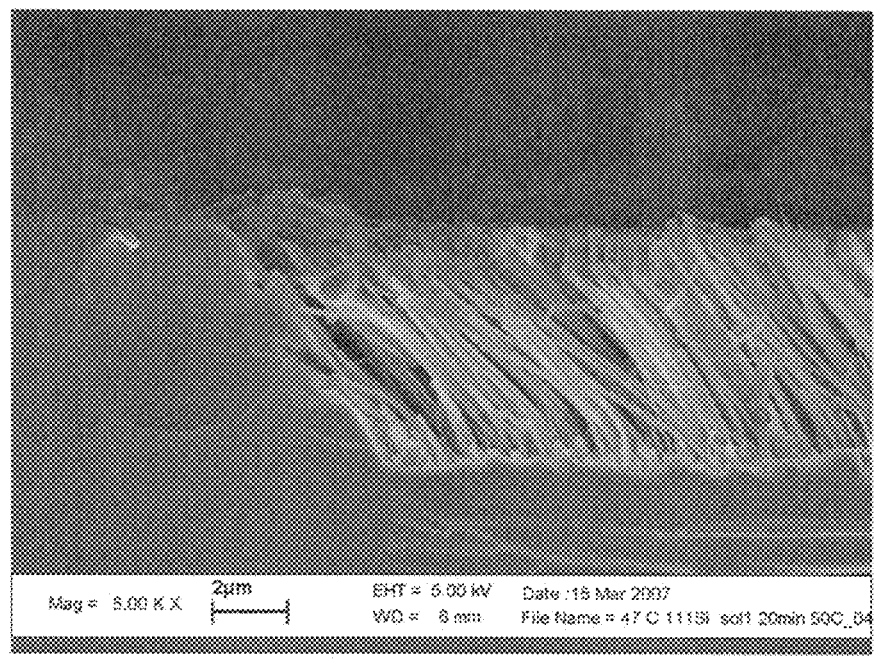
FIG. 11 shows a side-view, 5,000-fold magnification SEM image of silicon nanowires obtained from a substrate etched from the (1 1 1) plane, the nanowires forming a 54.7 degree angle with the substrate.
Figure 12:
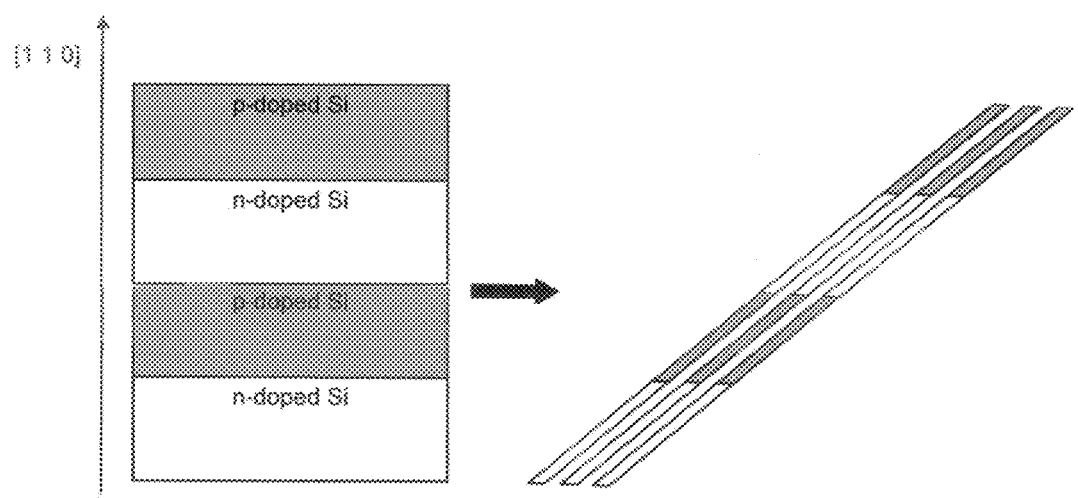
FIG. 12 shows silicon nanowires obtained from a substrate etched from the (1 1 0)plane, the two n-doped and two p-doped segments forming a 60 degree angle with the longitudinal direction of the nanowire, which corresponds to the silicon [1 0 0] crystalline direction.

FIG. 11 shows a side-view, 5,000-fold magnification SEM image of silicon nanowires obtained from a substrate etched from the (1 1 1) plane, the nanowires forming a 54.7 degree angle with the substrate.

The term "comprising" (and its grammatical variations) as used herein is used in the inclusive sense of "having" or "including" and not in the exclusive sense of "consisting only of" The terms "a" and "the" as used herein are understood to encompass the plural as well as the singular.

All publications, patents and patent applications cited in this specification are herein incorporated by reference, and for any and all purpose, as if each individual publication, patent or patent application were specifically and individually indicated to be incorporated by reference. In the case of inconsistencies, the present disclosure will prevail.

The foregoing description of the disclosure illustrates and describes the present disclosure. Additionally, the disclosure shows and describes only the preferred embodiments but, as mentioned above, it is to be understood that the disclosure is capable of use in various other combinations, modifications, and environments and is capable of changes or modifications within the scope of the concept as expressed herein, commensurate with the above teachings and/or the skill or knowledge of the relevant art.

The embodiments described hereinabove are further intended to explain best modes known of practicing it and to enable others skilled in the art to utilize the disclosure in such, or other, embodiments and with the various modifications required by the particular applications or uses. Accordingly, the description is not intended to limit it to the form disclosed herein. Also, it is intended that the appended claims be construed to include alternative embodiments.

What is claimed is:

1. A segmented nanowire comprising a plurality of segments greater than two stacked on top of each other and alternating between a first segment of a first material and a second segment of a second material, wherein an interface between different segments is oriented in a non-perpendicular angle towards a longitudinal direction of the segmented nanowire, wherein the first material and the second material are selected from the group consisting of Si, SiGe, GaP, GaAsP, ZnS, Ge, GeAs, GaInAs and ZnSe, and wherein the segmented nanowire is a three-dimensional quantum well structure.

2. A solar cell comprising the segmented nanowire according to claim 1.

3. A vertical cavity surface emitting laser, a light-emitting diode, or an opto-electronic device comprising the segmented nanowire according to claim 1.

4. The segmented nanowire of claim 1, wherein said angle is about 60°.

5. The segmented nanowire of claim 1, wherein said angle is about 54.7°.

6. The segmented nanowire of claim 1, which is a segmented nano-ribbon.

7. The segmented nanowire of claim 1, which has a faceted surface.

8. An electrical, optical, or thermoelectric device comprising the segmented nanowire according to claim 1.

9. The segmented nanowire of claim 1, wherein one of the first material or the second material is Si and the other of the first material or the second material is SiGe.

10. The segmented nanowire of claim 1 having a cross-sectional dimension from 10 nanometers to 500 nanometers.

11. The segmented nanowire of claim 1 comprising alternating segments of Si/SiGe/Si/SiGe or Si/Ge/Si/Ge.

12. The segmented nanowire of claim 1 comprising alternating segments of Si/Ge/Si/Ge.

13. A segmented nanowire comprising a plurality of segments greater than two stacked on top of each other and alternating between a first segment of a first material and a second segment of a second material, wherein an interface between different segments is oriented in a non-perpendicular angle towards a longitudinal direction of the segmented nanowire, and having a cross-sectional dimension from 10 nanometers to 500 nanometers, and wherein the segmented nanowire is a three-dimensional quantum well structure.

14. A solar cell comprising the segmented nanowire according to claim 13.

15. A vertical cavity surface emitting laser, a light-emitting diode, or an opto-electronic device comprising the segmented nanowire according to claim 13.

16. The segmented nanowire of claim 13, wherein said angle is about 60°.

17. The segmented nanowire of claim 13, wherein said angle is about 54.7°.

18. The segmented nanowire of claim 13, which is a segmented nano-ribbon.

19. (The segmented nanowire of claim 13, wherein the first material and the second material are selected from the group consisting of Si, SiGe, GaP, GaAsP, ZnS, Ge, GeAs, GaInAs and ZnSe.

20. The segmented nanowire of claim 13, which has a faceted surface.

21. An electrical, optical, or thermoelectric device comprising the segmented nanowire according to claim 13.

22. The segmented nanowire of claim 13, wherein one of the first material or the second material is Si and the other of the first material or the second material is SiGe.

23. The segmented nanowire of claim 13 comprising alternating segments of Si/SiGe/Si/SiGe or Si/Ge/Si/Ge.

24. The segmented nanowire of claim 13 comprising alternating segments of Si/Ge/Si/Ge.

* * * * *